(12) United States Patent
Kennan et al.

(10) Patent No.: US 12,113,483 B2
(45) Date of Patent: *Oct. 8, 2024

(54) DC COUPLED AMPLIFIER HAVING PRE-DRIVER AND BIAS CONTROL

(71) Applicant: MACOM Technology Solutions Holdings, Inc., Lowell, MA (US)

(72) Inventors: Wayne Kennan, Lowell, MA (US); Baotoan Nguyen, Lowell, MA (US)

(73) Assignee: MACOM Technologies Solutions Holdings, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/070,336

(22) Filed: Nov. 28, 2022

(65) Prior Publication Data
US 2023/0092922 A1 Mar. 23, 2023

Related U.S. Application Data

(63) Continuation of application No. 16/888,294, filed on May 29, 2020, now Pat. No. 11,515,841.

(60) Provisional application No. 62/855,764, filed on May 31, 2019.

(51) Int. Cl.
| | |
|---|---|
| *H03F 3/45* | (2006.01) |
| *H03F 1/02* | (2006.01) |
| *H03F 1/22* | (2006.01) |
| *H03G 1/00* | (2006.01) |

(52) U.S. Cl.
CPC .......... *H03F 1/0233* (2013.01); *H03F 1/223* (2013.01); *H03F 3/45085* (2013.01); *H03F 2200/279* (2013.01); *H03G 1/0023* (2013.01); *H03G 1/0029* (2013.01); *H03G 1/0088* (2013.01)

(58) Field of Classification Search
CPC .... H03F 1/0233; H03F 1/223; H03F 3/45085; H03F 2200/279; H03G 1/0023; H03G 1/0029; H03G 1/0088
USPC .......................... 330/285, 262–261, 277, 286
See application file for complete search history.

(56) References Cited

U.S. PATENT DOCUMENTS

| | | | |
|---|---|---|---|
| 4,885,550 A | 12/1989 | Ferrer | |
| 5,798,664 A | 8/1998 | Nagahori | |
| 5,920,230 A | 7/1999 | Beall | |
| 6,140,872 A * | 10/2000 | McEldowney | ..... H03F 3/45977 330/253 |

(Continued)

FOREIGN PATENT DOCUMENTS

| | | |
|---|---|---|
| JP | 2009060361 | 3/2009 |
| KR | 10-2004-0107996 | 6/2006 |

*Primary Examiner* — Andrea Lindgren Baltzell
*Assistant Examiner* — Khiem D Nguyen
(74) *Attorney, Agent, or Firm* — Weide & Miller, Ltd.

(57) ABSTRACT

A dc coupled amplifier includes a pre-driver, and amplifier and a bias control circuit. The pre-driver is configured to receive one or more input signals and amplify the one or more input signals to create one or more pre-amplified signals. The amplifier has cascode configured transistors configured to receive and amplify the one or more pre-amplified signals to create one or more amplified signals, the amplifier further having an output driver termination element. The bias control circuit is connected between the pre-driver and the amplifier, the bias control circuit receiving at least one bias current from the output driver termination element of the amplifier, wherein the pre-driver, the amplifier and the bias control circuit are all formed on a same die.

18 Claims, 10 Drawing Sheets

(56) References Cited

U.S. PATENT DOCUMENTS

| | | |
|---|---|---|
| 7,768,353 B2 | 8/2010 | Chang |
| 8,742,845 B2 | 6/2014 | Dusad |
| 11,515,841 B2 * | 11/2022 | Kennan .................. H03F 3/195 |
| 2007/0188227 A1 | 8/2007 | Maejima |
| 2012/0235744 A1 | 9/2012 | Albertini |
| 2014/0327483 A1 * | 11/2014 | Balteanu .................. H03F 3/68 |
| | | 330/295 |
| 2017/0288618 A1 | 10/2017 | Amanis |

* cited by examiner

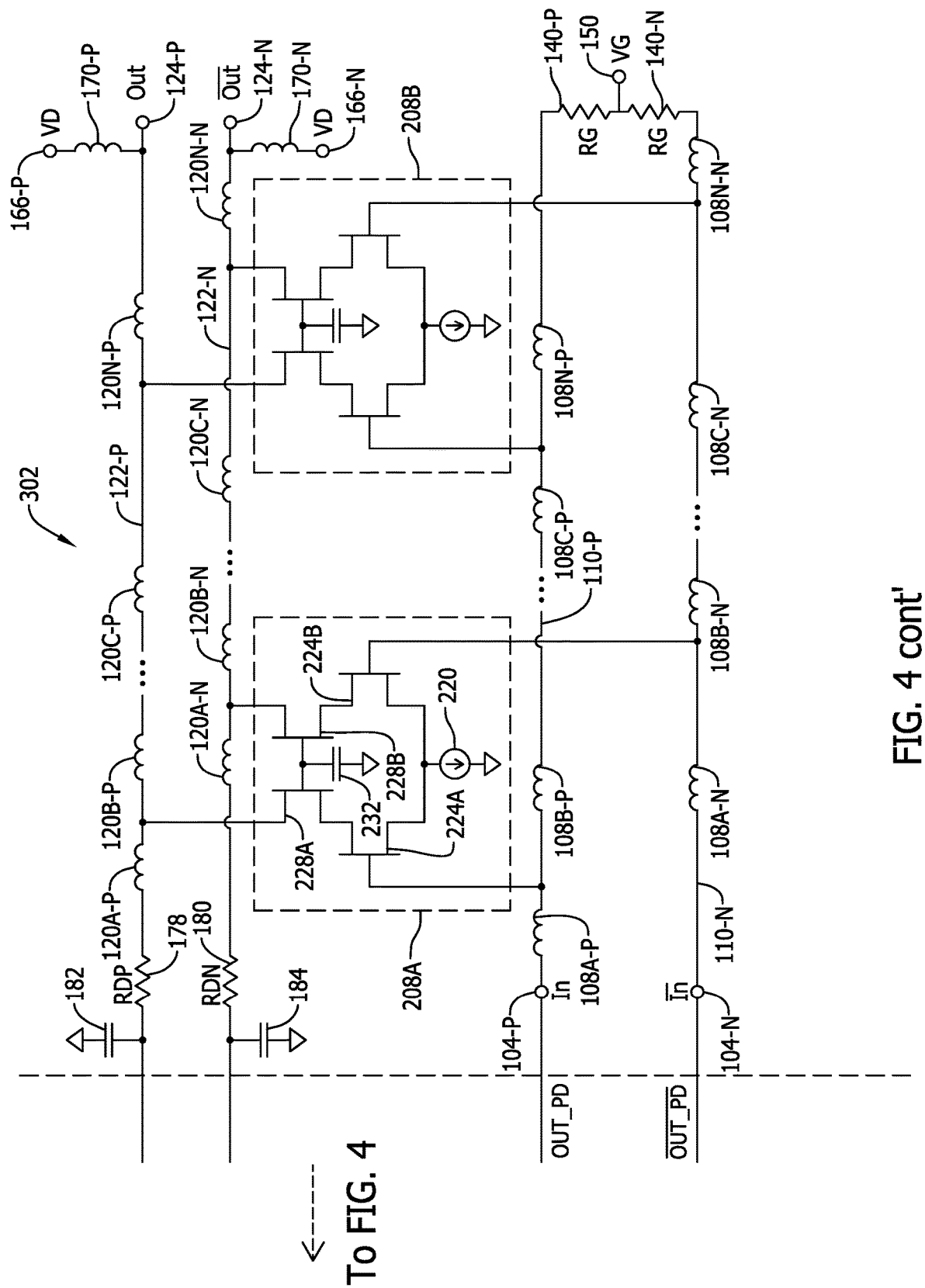
FIG. 4 cont' though shown with two amplifier sections 112A, 112B,
DC COUPLED AMPLIFIER HAVING PRE-DRIVER AND BIAS CONTROL

1. FIELD OF THE INVENTION

The field of the invention relates to amplifiers and in particular to an improved distributed amplifier and improved DC-coupled amplifier.

2. BACKGROUND

Distributed amplifiers, also known as traveling wave amplifiers, are a common amplifier configuration for wide bandwidth applications. FIG. 1 illustrates an example circuit of an exemplary prior art distributed amplifier. The distributed amplifier of FIG. 1 is a single ended configuration. As shown, an input node 104 is configured to receive a data signal to be amplified. The input node 104 connects to an inductor 108A. The opposite terminal of the inductor 108A connects to an inductor 108B and a first amplifier section 112A. The inductors 108 are in a circuit section defined herein as the input line.

The amplifier section 112A comprises two transistors connected source to drain as shown. The gate terminal of FET 154 connects to the inductors 108A and 108B. A capacitor 162 connects the gate terminal of FET 150 to ground. The drain terminal of the FET 150 connects to inductors 120A, 120B as shown. The opposite terminal of inductor 120A connects to an output termination resistor RD 130, which in turn connects to capacitor 134. Resistor RD 130 may also be referred to a drain resistor that is used for impedance matching and to set the output impedance. The opposite terminal of the capacitor 134 connects to ground. The output termination resistor RD 130 and capacitor 134 establish the output impedance seen from an output node 124. The inductors 120A, 120B are in a circuit section defined as the output line 122.

The FETs 150, 154 of the amplifiers sections 112 have parasitic capacitance and the inductors 108A, 108B, 120A, 120B arranged in the circuit are selected to cancel or counter the parasitic capacitance associated with the amplifier sections.

The arrangement of amplifier sections 112A and inductors 108A, 108B, 120A, 120B repeats with one or more additional amplifying sections 112B and inductors 108C, 108N and 120C and 120N where N is any whole number. An output node 124 connects to the inductor 120N. An inductor 170 also connects to the output node 124 and to a supply voltage VD 166. The supply voltage 166 provides a DC supply voltage to the circuit, for biasing.

Also, part of this distributed amplifier is an input termination resistor 140 and a capacitor 144 which connect in series to ground to provide input impedance matching. A supply voltage VG 150 is supplied at a node between the input termination resistor 140 and capacitor 144.

Although shown with two amplifier sections 112A, 112B, it is contemplated that any number of sections may be implemented to increase gain or establish other circuit characteristics.

In operation, the input signal is presented to the input node 104 and in turn to the first amplifier section 112A where it is amplified, and the amplified signal is presented on the output line 122. The process repeats through one or more additional amplifier sections 112 such that an amplified output signal is presented on the output node 124. The input impedance is set, at least in part, by the input termination resistor RG 140 and capacitor 144. The resistor RG 140 may also be referred to a gate resistor used to set input impedance. The output impedance is set, at least in part, by the output termination resistor 130 and capacitor 134. The inductors 108A, 108B, 120A, 120B cancel the parasitic capacitance of the amplifier sections.

FIG. 2 illustrates an example circuit arrangement for an exemplary prior art distributed amplifier in a differential mode configuration. As compared to FIG. 1, similar elements are labeled with similar reference numbers. However, due to the differential configuration the arrangement is a mirrored collection of components. As is understood in the art, the differential configuration includes two inputs 104-P and 104-N. The inputs 104-P, 104-N receive differential signals that are 180 degrees out of phase with respect to the other. The signal of interest is the difference between the differential signal presented on inputs 104-P, 104-N. The -P and -N designations reflect the two separate but similar arrangements of elements, which are generally mirrored to form the differential configuration. Likewise, the inductors 108 are separated by -P and -N designation with the reference numbers. Due to the generally similar, but duplicate nature of the differential configuration, in the discussion of FIG. 2 only the aspects of FIG. 2 which differs from FIG. 1 are discussed.

FIG. 2 includes differential amplifier sections 208A, 208B which connect as shown to the input lines 110-P, 110-N and the output lines 122-P, 122-N. Each differential amplifier section 208 includes several components. As in FIG. 1, connected between inductors 108A-P and inductors 108B-P is a gate terminal of FET 224A. The drain terminal of FET 224A connects to the source terminal of a FET 228A. This configuration is mirrored with FETs 224B and 228B as shown such that the gate terminals of FETs 228A, 228B are connected and the source terminals of FETs 224A, 224B are connected. This is referred to as a common source configuration for the FETs 224 and a common gate arrangement for the FETs 228. The drain terminals of FETs 228A and 228B connect to the output lines 122-P and 122-N. A capacitor 232 connects between ground and the gate terminals of FETs 228A, 228B. A current source 220 connects between ground and the source terminals of FETs 224A, 224B. The node between the current source 220 and the source terminals of the FETs 224 becomes a virtual ground when presented with a differential signal. One or more additional differential amplifying sections 208B are similarly configured.

In operation, a differential signal is presented on the inputs 104-P and 104-N and thus presented to the differential amplifier sections 208A, . . . 208B while the amplified version of the input signals is presented on the outputs 124-P and 124-N. Similar to FIG. 1, the supply voltage VD 166-P provides the bias for the positive side of the amplifier through an inductor 170-P. The voltage VD 166-N and inductor 170-N provide the bias for the negative side of the amplifier. In the differential amplifier configuration, the voltage VD 166-P and 166-N either have equal values or can be connected to the same DC voltage supply. Also, in this embodiment, the inductor 170-P and inductor 170-N are identical but may be different in value in other embodiments. The voltage supply VG 150 is supplied at the node between resistor 140-P and resistor 140-N to provide the gate bias for both sides of the differential amplifier.

While prior art designs, such as those shown in FIGS. 1 and 2 are suitable for certain applications, improvements would benefit the state of the art. Disclosed herein are improvements to amplifiers and pre-amplifiers as are discussed below.

SUMMARY

To overcome the drawbacks of the prior art and provide additional benefits, disclosed is a DC-coupled amplifier comprising a pre-driver, amplifier and a bias control circuit. The pre-driver is configured to receive one or more input signals and amplify the one or more input signals to create one or more pre-amplified signals. The amplifier has cascode arranged transistors configured to receive and amplify the one or more pre-amplified signals to create one or more amplified signals, the amplifier further having an output driver termination element. In other embodiment, a cascode design is not used, thus allowing for any amplifier configuration other than a cascode configuration. The bias control circuit is connected between the pre-driver and the amplifier, the bias control circuit receiving at least one bias current from the output driver termination element of the amplifier, wherein the pre-driver, the amplifier and the bias control circuit are all formed on a same die.

Disclosed herein is an amplifier system comprising a pre-driver configured to receive the one or more input signals, and amplify the one or more input signals to create one or more pre-amplified signals. Also part of this embodiment is an amplifier configured to receive and amplify the one or more pre-amplifier input signals to create one or more amplified signals. The amplifier may include an output driver termination element. A bias control circuit is connected between the pre-driver and the amplifier. The bias control circuit receives at least one bias control circuit input current from the output driver termination element of the amplifier. In this embodiment, the pre-driver, bias control circuit, and the amplifier are formed on a same die.

In one embodiment, the amplifier system includes a bias control circuit that includes one or more transistors configured as level shifters that control a voltage provided to the pre-driver. The amplifier system die may be a gallium arsenide die. The bias control circuit includes one or more transistors configured to ensure that the pre-driver bias current is insensitive to process variation and bias voltage variation. In one configuration, the pre-driver includes one or more amplifier sections, each of which receive a bias signal from the bias control circuit. Each amplifier section may be formed from two transistors in a common source configuration. In one embodiment, the amplifier is a DC-coupled amplifier having cascode connected transistors. The amplifier system may further comprise a gain control circuit configured with the pre-driver, such that the gain control circuit controls gain of the pre-driver based on a gain control signal.

Also disclosed herein is a method for amplifying a signal with an amplifier. This method includes providing a pre-driver, an amplifier and a bias control circuit on the same die and providing one or more input signals to the pre-driver. Then, amplify the one or more input signals with the pre-driver to create one or more pre-amplified signals and providing one or more pre-amplified signals to the amplifier, subsequently amplifying the one or more amplifier input signals to create one or more amplified signals and one or more bias control circuit input currents. This method then provides the bias control circuit with the one or more bias control circuit input currents and generates the one or more bias control signals with the bias control circuit.

The bias control circuit may include one or more transistors configured as level shifters that control a voltage provided to the pre-driver. In one embodiment, the die is a gallium arsenide die. The method may further comprise providing a gain control circuit and receiving a gain control signal at the gain control circuit to thereby control the gain of the pre-driver. In one embodiment, the pre-driver includes one or more amplifier sections, each of which receives a bias signal from the bias control circuit. In one configuration, each amplifier section is formed from two transistors in a common source configuration. The amplifier may comprise an output driver termination element and the bias control circuit receives the one or more bias control circuit input currents from the output driver termination element of the amplifier.

Also disclosed herein is an amplifier system comprising a pre-driver configured to receive one or more input signals and pre-amplify the one or more input signals to create one or more pre-amplified signals. A gain control system is part of the amplifier system and is configured as part of the pre-driver. The gain control system controls the pre-driver gain in response to a gain control signal provided to the gain control system. An amplifier is configured to receive and amplify the one or more pre-amplified signals to create one or more amplified signals. A bias control circuit is connected between the pre-driver and the amplifier. The bias control circuit receiving at least one bias control circuit input current from the amplifier, such that the pre-driver, the gain control circuit, the bias control circuit, and the amplifier are formed on the same die.

In one configuration, the bias control circuit includes one or more transistors configured as level shifters that control a voltage provided to the pre-driver. The bias control circuit includes one or more transistors configured to ensure that the pre-driver bias current is insensitive to process variation and bias voltage variation. In one embodiment, the pre-driver includes three amplification sections, each of which receives a bias signal from the bias control circuit. Each amplifier section may be formed from two transistors in a common source configuration.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DISCUSSION OF THE INVENTION

Figure 1:
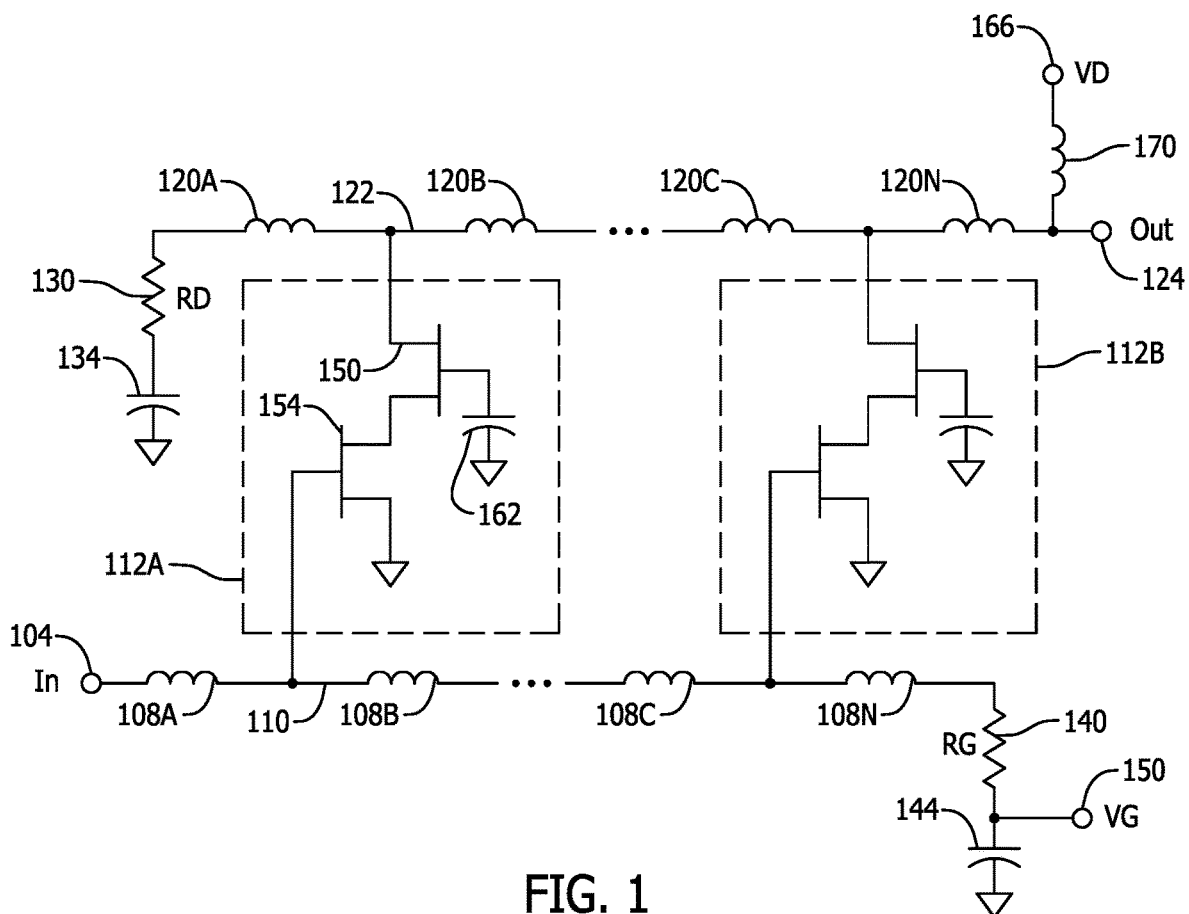
FIG. 1 illustrates an example circuit of an exemplary prior art distributed amplifier.
Figure 2:
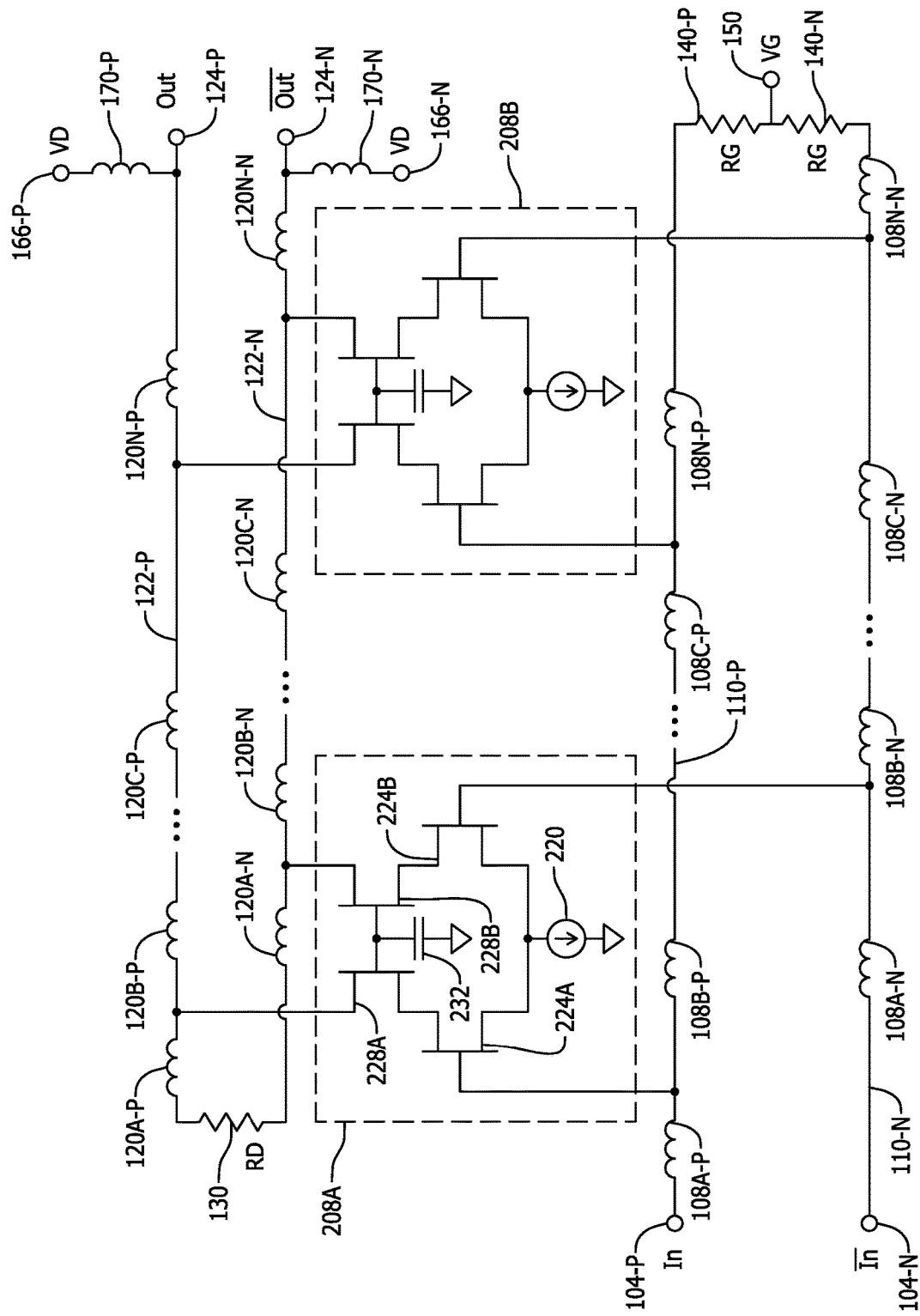
FIG. 2 illustrates an example circuit arrangement for an exemplary prior art distributed amplifier in a differential mode configuration.

Distributed amplifiers such as those identified in FIG. 1 and FIG. 2 are commonly fabricated of either Gallium Arsenide, Silicon Germanium, a combination of both, or any other material or process. Silicon Germanium has many performance advantages such as higher gain and bandwidth but Gallium Arsenide inherently provides higher output voltage and lower power dissipation. For applications requiring relatively high output voltage and gain, typical prior art applications have used a Silicon Germanium pre-driver stage and a Gallium Arsenide output driver stage in one package.

Improvements are possible over the prior art applications. One area for improvement over the prior art is significantly reduced amplifier (driver and pre-driver) size and cost. This system improves the prior art by reducing the size and cost of a distributed amplifier (driver and pre-driver) while maintaining the same or higher gain level, while also maintaining or increasing bandwidth. As compared to the prior art, this is achieved by incorporating a pre-driver and the output driver on a single Gallium Arsenide die with high gain. This provides significantly reduced amplifier size and cost and the integrated driver and pre-driver stages are easier to use.

Figure 3A:
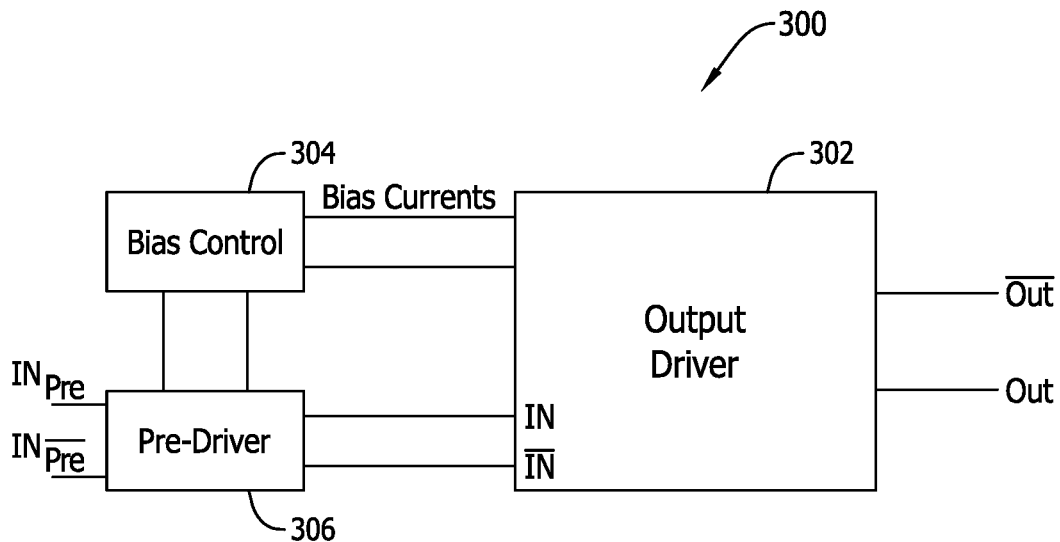
FIG. 3A is a block diagram of a DC-coupled amplifier in accordance with an embodiment of the invention.

FIG. 3A illustrates a block diagram of an improved DC-coupled amplifier 300, such as would be used instead of the distributed amplifier of FIG. 2. The DC-coupled amplifier 300 includes an output driver 302, a bias control section 304 and a pre-driver section 306. The pre-driver section 306 and the output driver section 302 are both differential amplifiers, and thus include differential inputs as shown. The pre-driver section 306 amplifies its differential inputs $IN_{Pre}$ and $\overline{IN}_{Pre}$ to output amplified differential inputs IN and $\overline{IN}$, under bias control by bias control section 304. The bias control section 304 receives bias currents from the output driver section 302, as will be explained in conjunction with FIG. 4. In one embodiment, the bias control 304, the pre-driver 306, and the output driver 302 are all on the same die. By placing all these elements on the same die, the otherwise required off die AC coupling capacitor between separate dies can be avoided, thus saving space and cost per unit, while maintaining ideal voltage levels and reducing capacitance and inductance. The capacitor required in the prior art may be a 10000 picofarad capacitor. It is preferred to have the voltage on the output of the pre-driver be the same as the voltage on the input to the driver circuit. In the prior art, the output pre-driver voltage may be 3 volts and the input to the driver amplifier may be 1 volt. To connect these two elements, the off-die capacitor was utilized to pass the RF signal while blocking the DC signal.

Figure 3B:
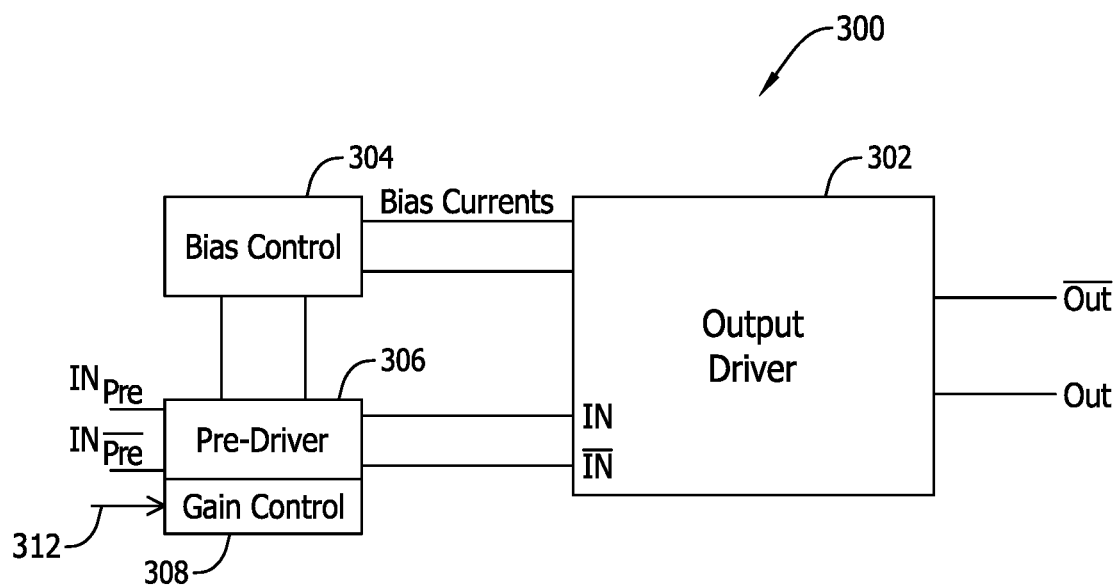
FIG. 3B is a block diagram of a DC-coupled amplifier in accordance with another embodiments of the invention.

FIG. 3B illustrates a block diagram of an alternative embodiment of a DC-coupled amplifier 300. As compared to FIG. 3A, similar elements are labeled with identical reference numbers. In this embodiment, the pre-driver 306 includes a gain control module 308 that receives a gain control signal on control input 312. The gain control signal and the gain control module allow the gain of the pre-driver to be adjusted manually or automatically. The gain control module 308 is discussed below in greater detail in connection with FIG. 6.

Pre-Driver Section

Figure 4:
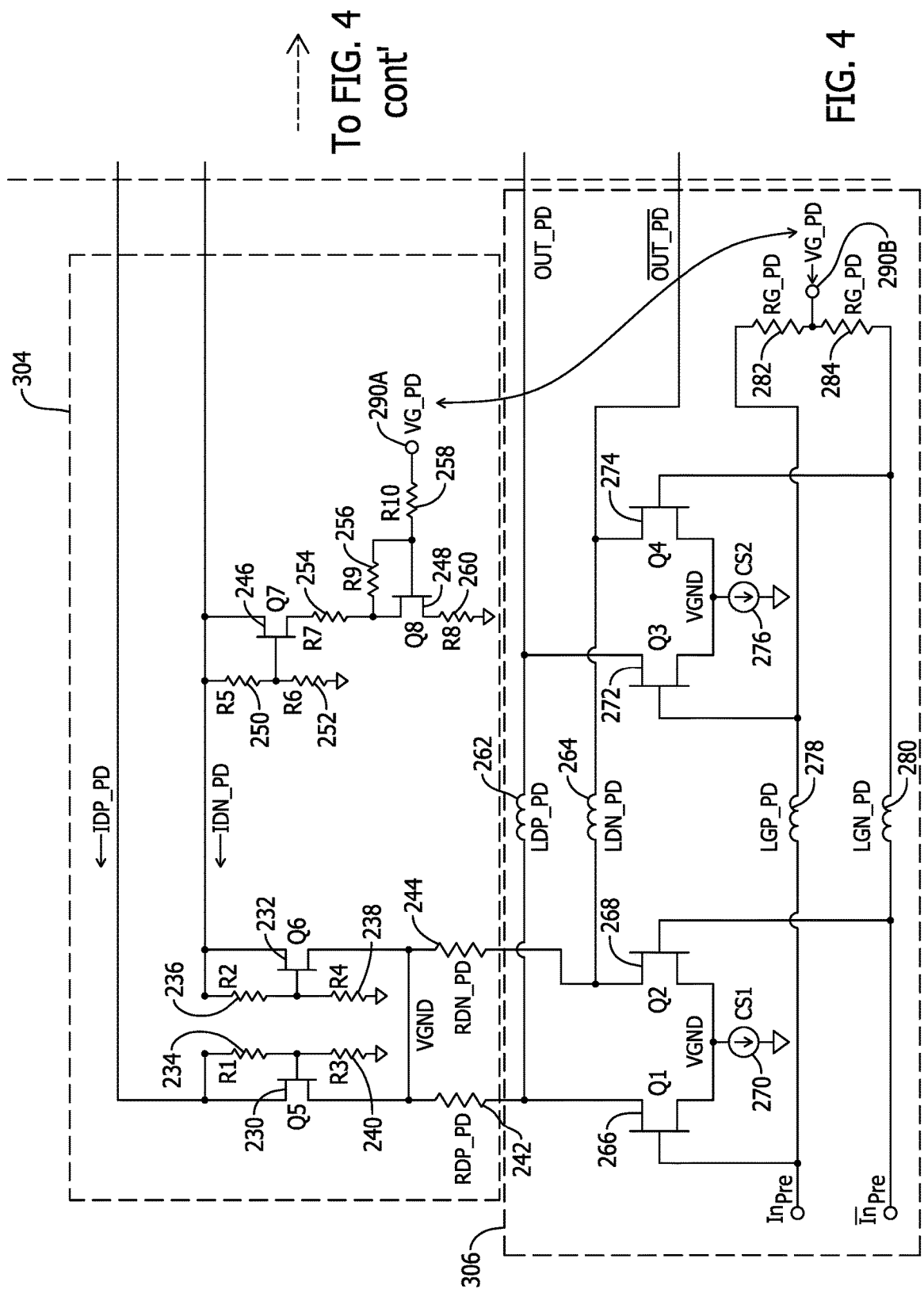
FIG. 4 is a circuit diagram showing details of the DC-coupled amplifier illustrated in FIG. 3.

The pre-driver section 306 is shown in FIG. 4. The pre-driver section 306 amplifies differential inputs $IN_{Pre}$ and $\overline{IN}_{Pre}$, with $IN_{Pre}$ connected to inductor 278 and the gate of FET Q1 266, and with $\overline{IN}_{Pre}$ connected to inductor 280 and the gate of FET Q2 268. FET Q1 266 and FET Q2 268 form the first stage of the amplifier. Any number of stages may be used. In one embodiment, three stages are utilized. The source terminals of FETs 266 and 268 are connected in a common source configuration. A current source 270 connects between ground and the source terminals of FETs 266, 268. The current source 270 could be either a fixed current source or a variable current source. In one embodiment the current source 270 is a resistor. The node VGND associated with the current source 270 is a virtual ground so there is no signal present. Nodes labeled VG_PD are also a virtual ground and thus there is no signal present at these nodes. This designation is found through the embodiments of FIG. 4. The drain of Q1 266 is connected to inductor 262 and to resistor 242, while the drain of transistor Q2 268 is connected to inductor 264 and to resistor 244.

A second stage of amplification of the pre-driver 306 is provided by transistors Q3 272, Q4 274 and current source 276, which are connected in the same configuration as the first stage of amplification provided by transistors Q1 266, Q2 268 and current source 270. While two stages of amplification are shown, any number of stages of amplification can be included within pre-driver 306 to provide additional gain.

The voltage supply VG_PD is provided at a voltage supply VG_PD node 290B between resistors RG_PD 282 and 284 to provide the gate bias for transistors Q1-Q4 266, 268, 272, 274. The pre-driver section 306 produces amplified outputs OUT_PD and $\overline{OUT\_PD}$ which are provided to the input terminals 104-P and 104-N of the output driver 302.

Bias Control Section

The bias control section 304 is shown in detail in FIG. 4. The bias control section 304 receives currents IDP_PD and IDN_PD, which the bias control section 304 uses to generate bias currents for the pre-driver 306.

IDP_PD is directed to the drain of transistor Q5 230 and to a first terminal of resistor R1 234. The second terminal of resistor R1 234 is connected to the gate of transistor Q5 230, and to a first terminal of resistor R3 240. The second terminal of resistor R3 240 is connected to ground. The source of transistor Q5 is connected to a first terminal of resistor RDP_PD 242, with the second terminal of resistor RDP_PD connected to the drain of transistor Q1 266 and Q3 272 to provide bias control.

IDN_PD is directed to the drain of transistor Q6 232 and to a first terminal of resistor R2 236. The second terminal of resistor R2 236 is connected to the gate of transistor Q6 232, and to a first terminal of resistor R4 238. The second terminal of resistor R4 238 is connected to ground. The source of transistor Q6 232 is connected to a first terminal of resistor RDN_PD 244, with the second terminal of resistor RDN_PD 244 connected to the drain of transistor Q2 268 and Q4 274 to provide bias control.

The gate voltages of transistors Q5 230 and Q6 232 are clamped by voltage divider resistors R1-R4 and are used to reduce the DC voltage on the drains of transistors Q1-Q4 in the pre-driver section 306. Additionally, the transistors Q5-Q7 in the bias control section ensure that the pre-driver bias current is insensitive to process variation and bias voltage variation. FETS Q5 230 and Q6 232 may be referred to as a level shifter that is part of the bias circuit 304. Q8 248 is the current mirror. A bias voltage is set up on transistor Q8 248 and by connecting its gate voltage VG_PD to other transistors, it mirrors the same bias condition to other transistors Q1-Q4 with same VG voltage.

The bias control section also includes transistor Q7 246 having a drain terminal connected to the line receiving bias current IDP_PD and to a first terminal of transistor R5 250. The gate of transistor Q7 246 is connected to a second terminal of resistor R5 250 and to a first terminal of resistor R6 252. A second terminal of resistor R6 252 is connected to ground. A source of transistor Q7 246 is connected to a first terminal of resistor R7 254. A second terminal of resistor R7 254 is connected to a drain of transistor Q8 and to a first terminal of resistor R9 256. The second terminal of resistor R9 256 is connected to the gate of transistor Q8 248 and to a first terminal of resistor R10 258. The second terminal of resistor R10 is an input terminal 290A that sets the voltage VG_PD, which is the same voltage VG_PD applied in the pre-driver section 306 at the node 290B between resistors 282 and 284. The source of transistor Q8 248 is connected to a first terminal of resistor R8 260, with the second terminal of resistor R8 260 connected to ground.

The transistor Q7 246 and associated resistors R5-R7 function as a level shifter that acts in a manner similar to transistors Q5 and Q6, to reduce the voltage applied to the drains of the transistors in the pre-driver section 306. The transistor Q8 and associated resistors R8-R10 acts as a current mirror to set the gate voltage on the transistors Q1-Q4 in the pre-driver section 306.

The value of resistors RDP_PD 242 and RDN_PD 244 may be adjusted to control the bias current applied to the pre-driver 306. In a preferred embodiment, the currents IDP_PD and IDN_PD may be set to 15 mA, although other pre-driver currents could be used in other embodiments.

Output Driver Section

The output driver section 302 is shown in detail in the right side of FIG. 4. The output driver section 302 shares most components with the amplifier of FIG. 2, and the like components that share reference numerals with the amplifier of FIG. 2 will not be further described. In addition to those elements, the output driver section includes resistors RDP 178 and RDN 180 connected to inductors 120A-P and 120A-N, respectively, and capacitors 182, 184 connected between resistors 178, 180 and ground. The resistors RDP 178 and RDN 180 are used to set the current to the pre-driver section 306, where the transistors Q5 230 and Q6 232 receive currents based on the voltage drop across the resistors RDP 178 and RDN 180.

By adding the pre-driver section 306 and bias control section 304 to the output driver section 302 and producing them on a same gallium arsenide die, the size of the DC-coupled amplifier 300 is reduced, while still producing the needed gain with simplified circuitry, thus avoiding the bandwidth reduction associated with larger FET size. Furthermore, two or more pre-driver sections can be added to achieve significant higher gain while maintaining the same bandwidth and very little increase in chip size. These are improvements over the prior art.

In operation, the differential input signals are provided to the pre-driver section 306 and amplified. The bias currents applied to the pre-driver section 306 are obtained using output driver termination resistors, and then the bias control uses single common source FETs to allow operation of the pre-driver section 306 at a low drain bias voltage (about 1V in a preferred embodiment). The pre-driver section 306 outputs amplified signals to the output driver section 302, which provides further amplification.

Figure 5A:
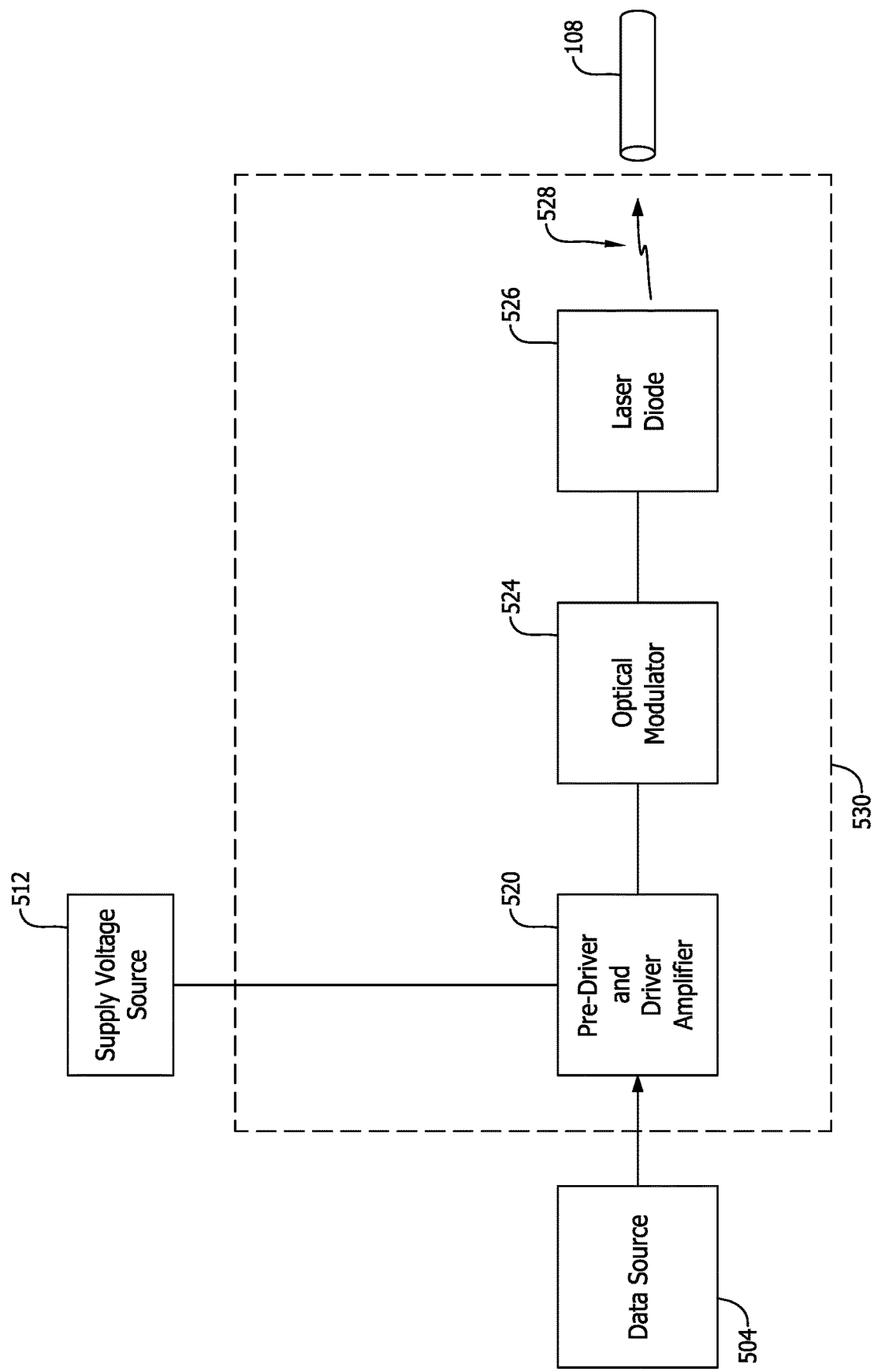
FIG. 5A is a block diagram illustrating an example environment of use of the innovation disclosed herein.

Many environments of use utilize distributed amplifiers. Distributed amplifiers are commonly found in optical transmitters to transmit data at high data rates between two locations. Numerous other environments of use rely on distributed amplifier and gain control elements. Foundational to optical communication systems is a driver amplifier which amplifies a modulating signal onto an optical modulator or directly onto a laser diode. FIG. 5A illustrates a block diagram of an example environment of use, namely, an optic signal transmitter. This is but one possible environment of use and it is contemplated that other environments of use are possible.

As shown in FIG. 5A, a data source 504 provides data for eventual transmission over an optic fiber 108. To achieve biasing of a driver, a supply voltage source 512 is provided to deliver power to the system. The supply voltage source 512 may be any source including a hard wire utility supplied power, power supply, battery, or any other source. The supply voltage source 512 provides a supply voltage to the pre-driver and driver amplifier 520. The pre-driver and driver amplifier 520 also receives the data to be transmitted in optic format from the data source 504. The pre-driver and driver amplifier 520 includes one or more amplifiers configured to amplify and modulate the data to a level suitable for driving an optical modulator 524 or laser diode 526. Responsive to the signal from the driver 520, the optical modulator 524 or laser diode 526 generates the optic signal 528, which is presented to the fiber optic cable 108, for transmission to a remote location such as for example another device in a data center or to a remote location in long haul applications. In the example configuration of FIG. 5A, elements inside the dashed line 530 are on one or more integrated circuits.

Figure 5B:
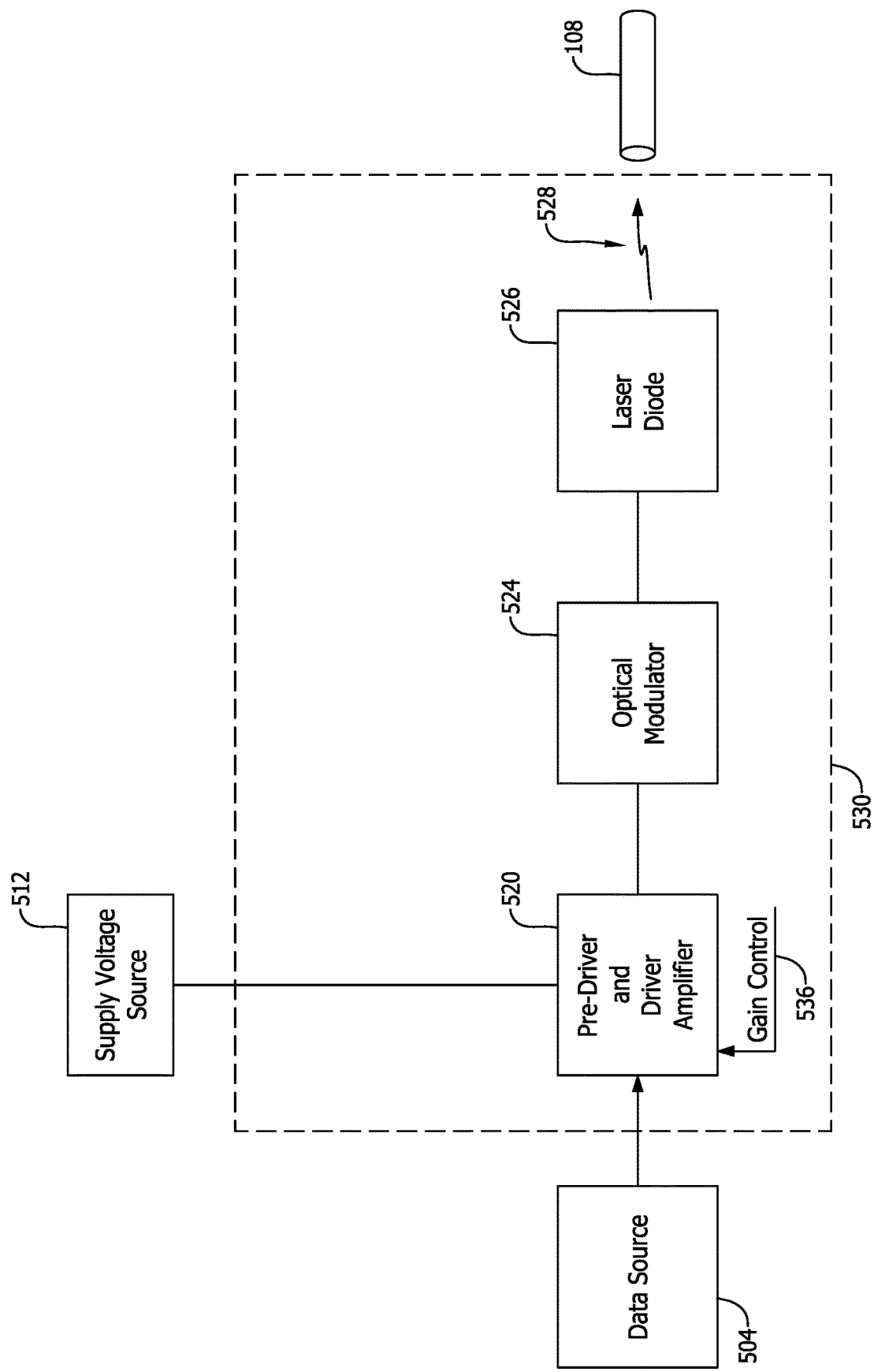
FIG. 5B is a block diagram illustrating another example environment of use of the innovation disclosed herein.

FIG. 5B illustrates a block diagram of an example environment of use of an alternative embodiment, namely, an optic signal transmitter. As compared to FIG. 5A, similar elements are labeled with identical reference numbers. In this example embodiment, the pre-driver and driver amplifier 520 includes a gain control input 536 that carries a gain control signal to the pre-driver and driver amplifier. This configuration is shown in greater detail in FIG. 6.

Figure 6A:
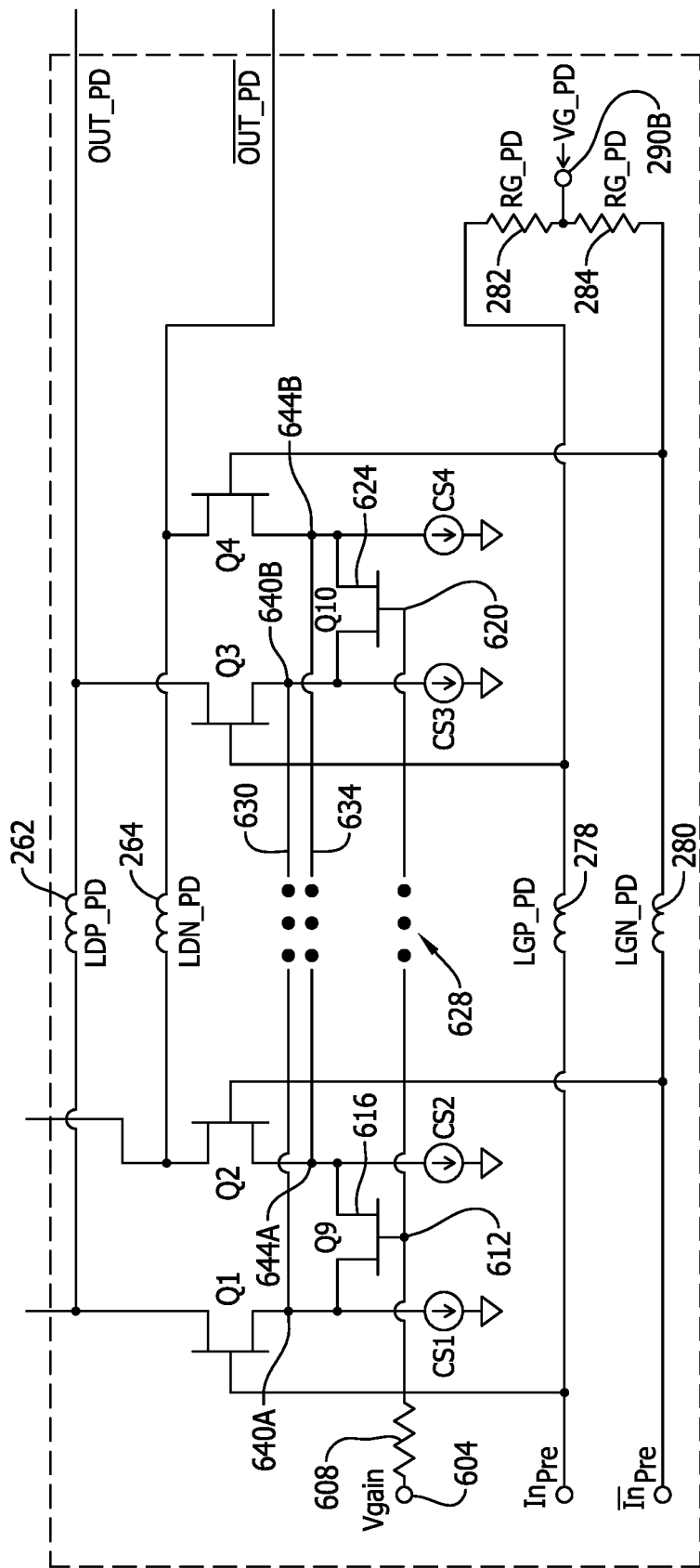
FIG. 6A is a block diagram illustrating an example embodiment of the pre-driver with gain control.

FIG. 6A illustrates an alternative embodiment of a pre-driver for use in the configuration of FIG. 4. This is but one possible configuration for a pre-driver with gain control. In FIG. 6A, a pre-driver with gain control is shown. The gain control system includes a gain control node 604 configured to receive a gain control signal Vgain. The gain control node 604 connects to a resistor 608. The opposing terminal of the resistor 608 connects to the gate 612 of FET Q9 616 and the gate 620 of FET Q10 624. Also shown are current sources CS1-CS4 which are connected as shown such that each FET Q1, Q2, Q3, and Q4 has its own current source. A fixed or variable resistor may be used as the current source. In one embodiment, CS1 and CS3 may be replaced by a single current source while CS2 and CS4 may be replaced by a single current source.

The gain control signal presents a voltage to the gates 612, 620 of the FETs 616, 624 to thereby control the resistance across the FETs 616, 624. As such, the FETs 616, 624 perform as variable resistors having a resistance set by the value of the gain control signal. This arrangement may be referred to as degeneration (or source degeneration) because it reduces the gain of the amplifier. For example, FET Q9 616 appears as a resistor and the resistance is controlled by the value of the voltage applied to the gate 612. When, turned on, with a high voltage at the gate, a low resistance is established which provides the maximum gain. When the FET Q9 is shut off due a low gain control voltage presented at the gate, this increases resistance and provides minimum gain. In addition, the transistors Q9, Q10 provide frequency equalization due to the parasitic capacitance between the drain and source terminals of FETs 612, 620. This equalized gain response is effective to counter the high frequency attenuation nature of the external transmission lines or other aspects of the circuit.

Also shown in FIG. 6A is an interconnect 630 between node 640A and node 640B. Likewise, an interconnect 634 is between node 644A and 644B. These interconnects bridge the sources of the FETs as shown. These connections are optional and may be beneficial in implementing the gain control circuitry.

In one embodiment, a single transistor is used in place of the transistors Q9 616 and Q10 624. Although shown with two pre-driver stages, the three dots indicate that additional pre-driver stages may be enabled. In one embodiment, the pre-driver has three stages. It should be noted that the transistors Q9 and Q10 function as a variable resistor but may be modeled as a variable resistor in parallel with a capacitor. Thus, with changes in the gain control signal, the resistance of transistors Q9 and Q10 changes, but the capacitance of these elements either do not change or the changes are insignificant. This provides the benefit of not reducing gain for high frequency components of the input signal at low and high gain levels. This in turn counters the inherent nature of transmission lines and circuits to attenuate high frequency signal components more than low frequency signal components. Thus, the gain changes more for low frequency than for high frequency, thus providing an additional benefit.

Figure 6B:
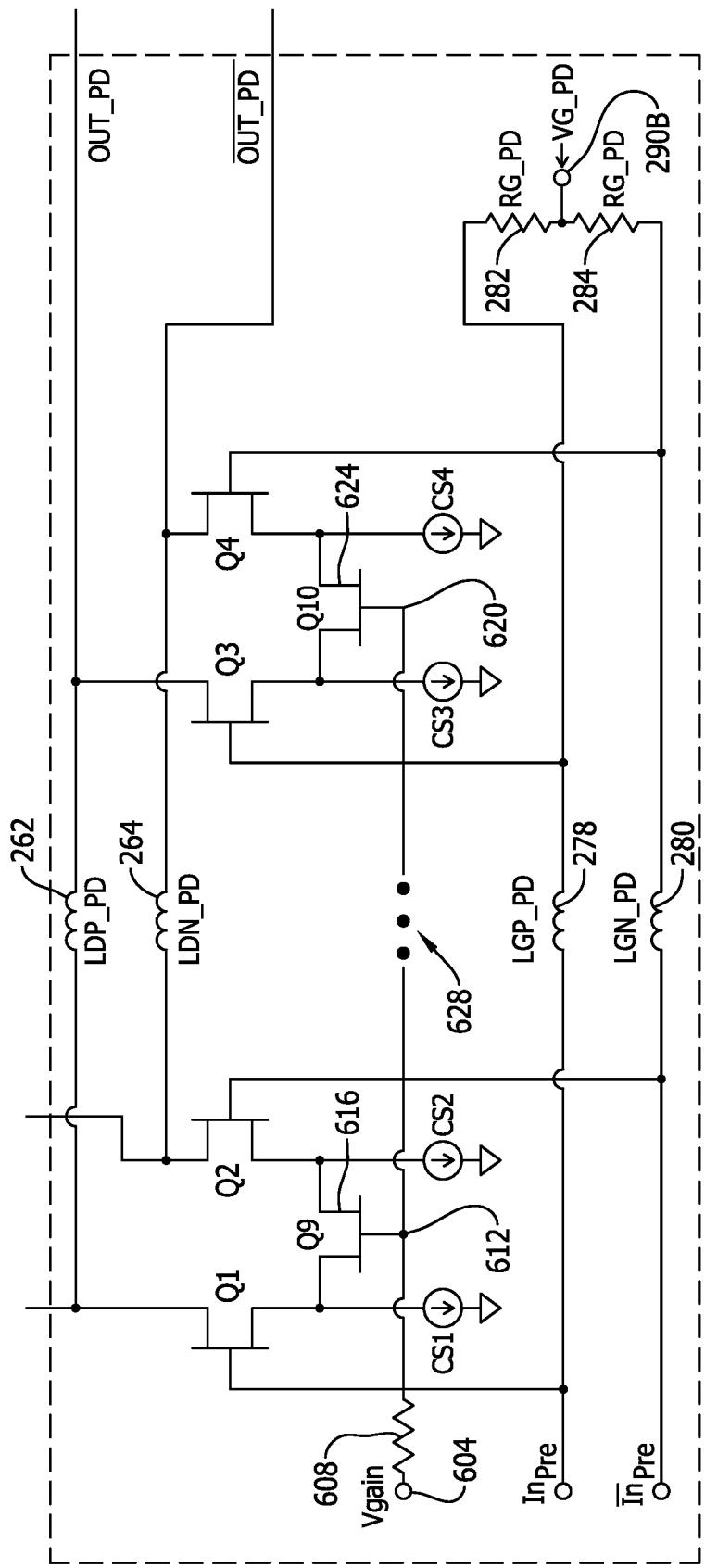
FIG. 6B is a block diagram illustrating an alternative embodiment of the pre-driver with gain control.

FIG. 6B is a block diagram illustrating an alternative embodiment of the pre-driver with gain control. In the embodiment of FIG. 6B, the interconnects 634 of FIG. 6A between node 644A and 644B is absent. Likewise, interconnect 630 between node 640A and node 640B is absent. These connections are optional and may be beneficial in implementing the gain control circuitry.

Figure 7:
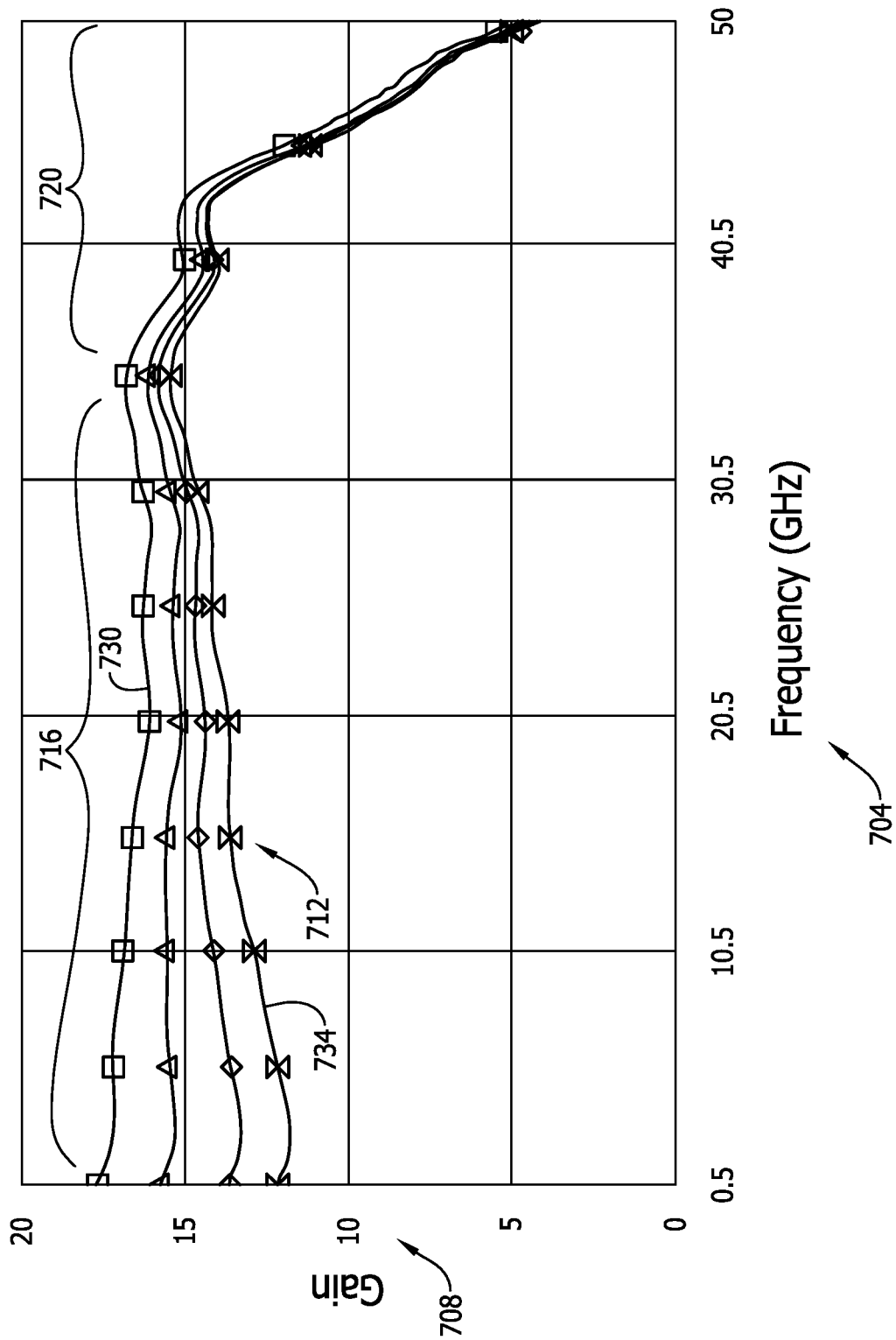
FIG. 7 illustrates a plot of gain versus frequency for the amplifier system with variable gain.

FIG. 7 illustrates a plot of gain versus frequency for the amplifier system with variable gain. This is but one possible plot of gain versus frequency for an amplifier as disclosed herein. The horizontal axis 704 represents frequency, while the vertical axis 708 represents gain. The plots 712 are shown for different gain levels. Plot 734 represents the signal at low gain levels while plot 730 represents the signal at high gain levels. As can be seen, the gain changes more at low frequency than high frequency and this is an added feature of this gain control circuit. This is desirable because at low gain levels, it is preferred to not reduce the gain of the high frequency components 720 because to do so would undesirably attenuate the high frequency components. This provides the benefit of frequency dependent equalization with less attenuation at high frequencies when gain is reduced.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An amplifier system, comprising:
   a pre-driver configured to receive one or more bias signals, from a bias circuit, and one or more input signals, and amplify the one or more input signals to create one or more pre-amplified signals;
   an amplifier, the amplifier comprising a distributed amplifier having two or more amplifier sections, configured to receive and amplify the one or more pre-amplified signals to create one or more amplified signals, the amplifier further having an output driver termination element; and
   the bias circuit, connected between the pre-driver and the amplifier, is configured to generate the one or more bias signals based on at least one bias circuit input current from the output driver termination element of the amplifier, such that the at least one bias circuit input current is provided to a level shifter circuit within the bias circuit which has a control voltage that is proportional to the at least one bias circuit input current based on a voltage divider resistor circuit which determines the control voltage of the level shifter circuit, wherein the pre-driver, bias circuit, and the amplifier are formed on a same die.

2. The amplifier system of claim 1 wherein the die is a gallium arsenide die.

3. The amplifier system of claim 1 wherein the bias circuit includes one or more transistors configured to ensure that the pre-driver bias current is insensitive to process variation and bias voltage variation.

4. The amplifier system of claim 1 wherein the pre-driver includes one or more amplifier sections, each of which receive a bias signal from the bias circuit.

5. The amplifier system of claim 4 wherein each amplifier section is formed from two transistors in a common source configuration.

6. The amplifier system of claim 1 wherein the amplifier is a DC coupled amplifier having cascode connected transistors.

7. The amplifier system of claim 1 further comprising a gain control circuit configured with the pre-driver, the gain control circuit controlling gain of the pre-driver based on a gain control signal.

8. A method for amplifying a signal with an amplifier system comprising:
   providing a pre-driver, an amplifier and a bias control circuit on the same die;
   providing one or more input signals and one or more bias signals to the pre-driver;
   amplifying the one or more input signals with the pre-driver to create one or more pre-amplified signals;
   providing one or more pre-amplified signals to the amplifier;
   amplifying the one or more pre-amplified signals to create one or more amplified signals and one or more bias control circuit input currents;
   providing the bias control circuit with the one or more bias control circuit input currents from the amplifier to a level shifter circuit comprising one or more transistors which are controlled by a control voltage such that the control voltage is generated by a resistive voltage divider circuit and the control voltage is proportional to the one or more bias control circuit input currents;
   generating, with a current mirror, a gate bias voltage, and providing the gate bias voltage to the pre-driver to bias a gate voltage of one or more transistors in the pre-driver;
   generating the one or more bias signals with the bias control circuit; and
   providing the one or more bias signals to the pre-driver.

9. The method of claim 8 wherein the die is a gallium arsenide die.

10. The method of claim 8 further comprising:
providing a gain control circuit; and
receiving a gain control signal at the gain control circuit to thereby control the gain of the pre-driver.

11. The method of claim 8 wherein the pre-driver includes one or more amplifier sections, each of which receive a bias signal from the bias control circuit.

12. The method of claim 11 wherein each amplifier section is formed from two transistors in a common source configuration.

13. The method of claim 8 wherein the amplifier further comprises an output driver termination element and the bias control circuit receives the one or more bias control circuit input currents from the output driver termination element of the amplifier.

14. An amplifier system, comprising:
a pre-driver having two or more stages, the pre-driver configured to;
  receive one or more input signals and one or more bias signals,
  receive one or more gate bias signals from a current mirror, the one or more gate bias signals proportional to and derived from at least one bias control circuit input current provided to the pre-driver from the amplifier; and
  pre-amplify the one or more input signals to create one or more pre-amplified signals;
an amplifier configured to receive and amplify the one or more pre-amplified signals to create one or more amplified signals; and
a bias control circuit connected between the pre-driver and the amplifier, the bias control circuit configured to receive, the at least one bias control circuit input current from the amplifier, at one or more drain terminals of one or more transistors in a level shifter circuit and generate the one or more bias signals which are proportional to the at least one bias control circuit input current from the amplifier, wherein the pre-driver, the bias control circuit, and the amplifier are formed on one die.

15. The amplifier system of claim 14 wherein the bias control circuit includes one or more transistors configured as level shifters that control a voltage provided to the pre-driver.

16. The amplifier system of claim 14 wherein resistors are arranged in series between the level shifter circuit and the pre-driver to set the current provided to the pre-driver.

17. The amplifier system of claim 14 wherein the pre-driver includes three amplification sections, each of which receives a bias signal from the bias control circuit.

18. The amplifier system of claim 17 wherein each amplifier section is formed from two transistors in a common source configuration.

* * * * *